(12) United States Patent
Jin

(10) Patent No.: US 7,101,791 B2
(45) Date of Patent: Sep. 5, 2006

(54) METHOD FOR FORMING CONDUCTIVE LINE OF SEMICONDUCTOR DEVICE

(75) Inventor: Sung Gon Jin, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 121 days.

(21) Appl. No.: 10/879,133

(22) Filed: Jun. 30, 2004

(65) Prior Publication Data

US 2005/0142767 A1    Jun. 30, 2005

(30) Foreign Application Priority Data

Dec. 24, 2003  (KR) .................... 10-2003-0096378

(51) Int. Cl.
*H01L 21/44* (2006.01)

(52) U.S. Cl. .................. 438/664; 438/653; 438/654; 438/655; 438/663; 438/652

(58) Field of Classification Search .................. None
See application file for complete search history.

(56) References Cited

U.S. PATENT DOCUMENTS

| 5,998,873 A | 12/1999 | Blair et al. |
| 6,221,764 B1 * | 4/2001 | Inoue .................... 438/649 |
| 6,667,233 B1 | 12/2003 | Ryoo et al. |
| 6,815,235 B1 * | 11/2004 | Markle .................... 438/16 |

FOREIGN PATENT DOCUMENTS

| KR | 1020010028503 A | 4/2001 |
| KR | 1020010048188 A | 6/2001 |

* cited by examiner

*Primary Examiner*—Luan Thai
(74) *Attorney, Agent, or Firm*—Heller Ehrman LLP

(57) ABSTRACT

A method for conductive line of semiconductor device is disclosed. A cobalt silicide layer is formed on an impurity junction region exposed through a contact hole. The cobalt silicide layer stabilizes a contact resistance so that the contact resistance of the impurity junction region does not vary in subsequent thermal processes.

7 Claims, 3 Drawing Sheets

METHOD FOR FORMING CONDUCTIVE LINE OF SEMICONDUCTOR DEVICE

BACKGROUND OF THE INVENTION

1. Field of the Invention

The present invention relates to method for forming conductive line of semiconductor device, and in particular to an improved method for forming conductive line of semiconductor device which provides improved contact resistance characteristics.

2. Description of the Background Art

A bit line structure, which is a data I/O path of semiconductor device, comprises a polycide structure consisting of a polysilicon layer and a tungsten silicide layer. In case of a highly integrated and high-speed semiconductor device, a tungsten bit line having low resistance is used instead since this structure has a limitation due to high sheet resistance.

Resistance stabilization is required for the tungsten bit lone because the contact resistance varies by the subsequent thermal processes.

Generally, the contact resistance is greatly increased during a subsequent thermal process in a P+ region where a thick Ti film is formed due to loss of dopants in a source/drain region. Therefore, a bit line comprising a relatively thin Ti film is used.

However, although the thin Ti film stabilizes the contact resistance of P+ region, contact resistances of N+ region and tungsten silicide layer of gate electrode are largely increased.

Therefore, the thickness of the Ti film is adjusted so that the contact resistances of P+ region and N+ region and gate region have moderate values.

However, as the contact area becomes smaller, the contact resistance, especially the contact resistance of gate electrode, is drastically increased as illustrated in FIG. 1. The thickness of the Ti film must be increased to reduce the contact resistance. However, increase in the thickness of the Ti film increase the contact resistance of P+ region as described above, resulting in a degradation of device characteristic.

SUMMARY OF THE INVENTION

Accordingly, it is an object of the present invention to provide method for forming conductive line of semiconductor device wherein a cobalt silicide layer is formed on a surface of a source/drain region to stabilize contact characteristics and improve reliability of the device.

In order to achieve the above-described object of the invention, there is provided a method for forming conductive line of semiconductor device, comprising: forming a lower insulating film on a semiconductor substrate including a gate electrode and an impurity junction region; etching the lower insulating film to form a first contact hole exposing a top surface of the gate electrode and a second contact hole exposing the impurity junction region; forming a cobalt silicide layer on the impurity junction region exposed through the second contact hole; forming a stacked structure of a Ti film and a TiN film on the semiconductor substrate including the first and the second contact holes; forming a conductive layer on the lower insulating film including the first and the second contact holes; and patterning the conductive layer to form a conductive line pattern.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A method for forming conductive line of semiconductor device in accordance with a preferred embodiment of the present invention will now be described in detail with reference to the accompanying drawings.

FIGS. 2A through 2D are cross-sectional diagrams illustrating method for forming conductive line of semiconductor device in accordance with the present invention.

Figure 1:
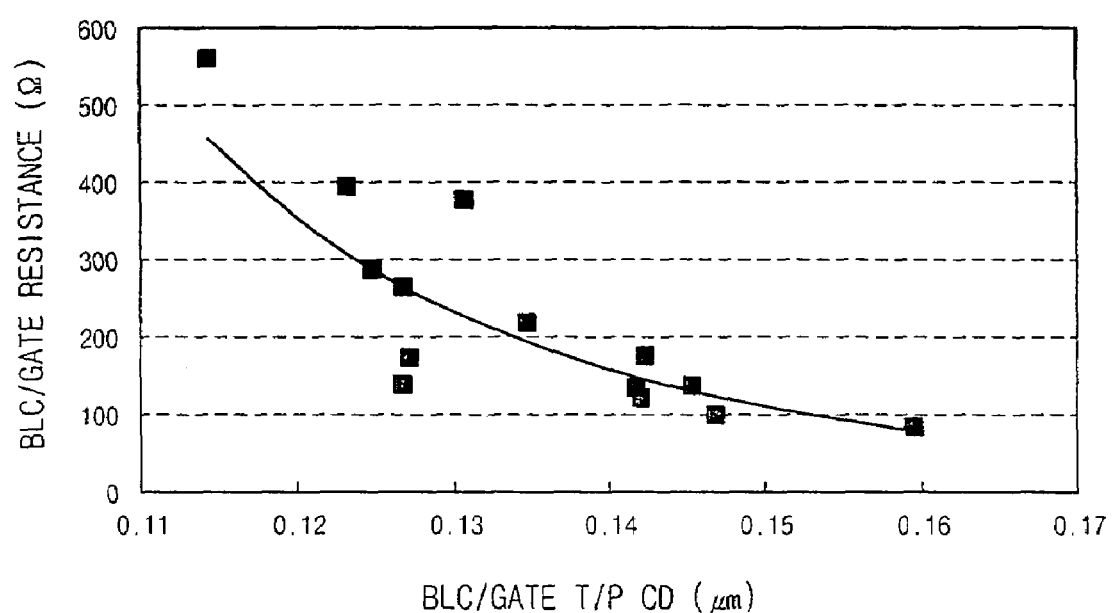
FIG. 1 is a graph illustrating variation of contact resistance according to variation of contact area.
Figure 2A:
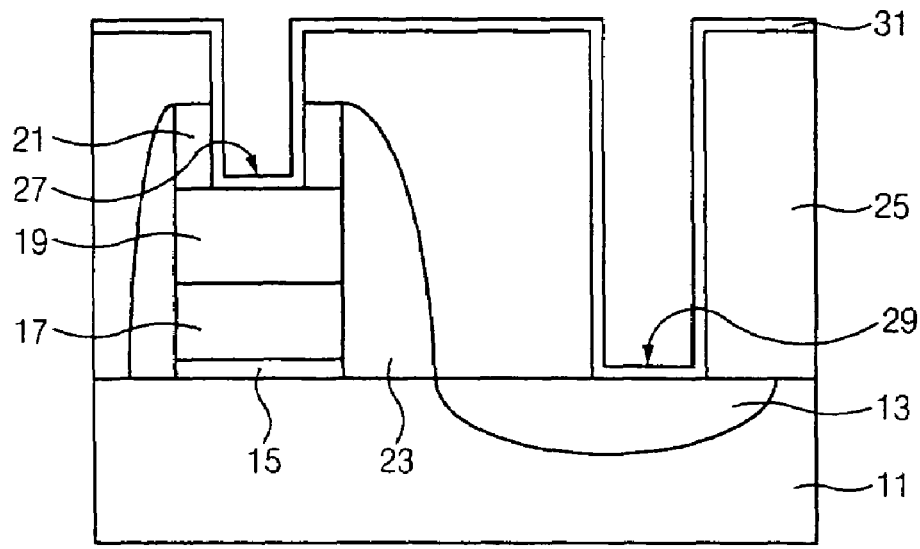
FIGS. 2A through 2D are cross-sectional diagrams illustrating method for forming conductive line of semiconductor device in accordance with the present invention.

Referring to FIG. 2A, a device isolation film (not shown) for defining an active region is formed on a semiconductor substrate 11.

Thereafter, a stacked structure of a gate oxide film 15, a polysilicon film 17 for gate electrode, a tungsten silicide layer 19 and a hard mask film 21 is formed on the semiconductor substrate 11. The stacked structure is then etched to form a gate electrode.

Next, an n-type or a p-type impurity is ion-implanted in the semiconductor substrate 11 using the gate electrode as an implant mask to form an impurity junction region 13.

Thereafter, an insulating film (not shown) is formed on the semiconductor substrate 11 and then anisotropically etched to form an insulating film spacer 23 at a sidewall of the gate electrode.

Next, a lower insulating film 25 planarizing the entire surface is formed on a semiconductor substrate 11. The lower insulating film 25 and the hard mask film 21 are selectively etched to form a first contact hole 27 exposing the tungsten silicide layer 19 and a second contact hole 29 exposing the impurity junction region 13.

Natural oxide films at the bottoms of the first contact hole 27 and the second contact hole 29 may be removed.

Thereafter, a cobalt film 31 is formed on the semiconductor substrate 11 including the first and the second contact holes 27 and 29. Preferably, the cobalt film 31 is formed via a PVD process and has a thickness ranging from 50 to 150 Å. A stacked structure of a cobalt film and a titanium nitride film may be used in place of the cobalt film 31.

Figure 2B:
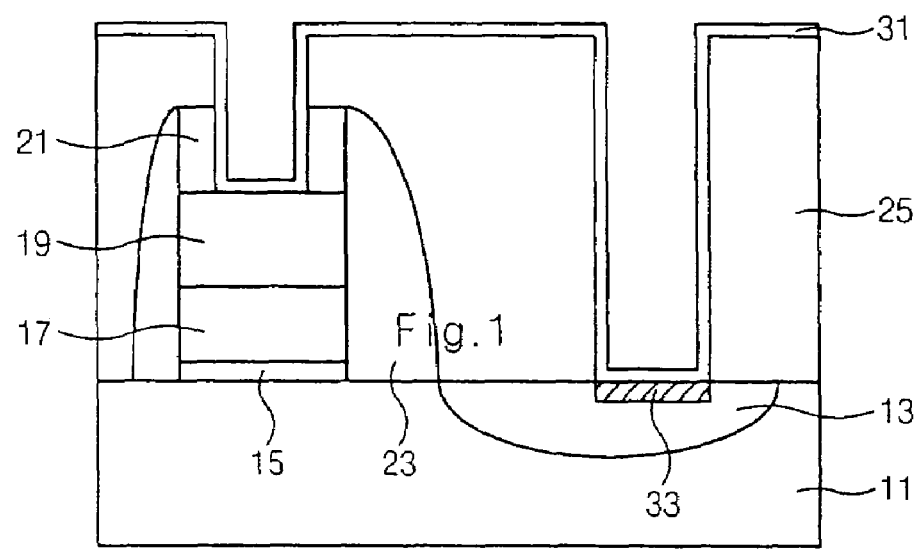

Referring to FIG. 2B, the cobalt film 31 is subjected to a rapid thermal process to react the cobalt film 31 with a surface of the impurity junction region 13, thereby forming a cobalt silicide layer 33.

Preferably, the rapid thermal process comprises a first rapid thermal process performed at a temperature ranging from 650 to 750° C. for 10 to 30 seconds and a second rapid thermal process performed at a temperature ranging from 800 to 880° C. for 10 to 30 seconds. The first rapid thermal process may be omitted.

Figure 2C:
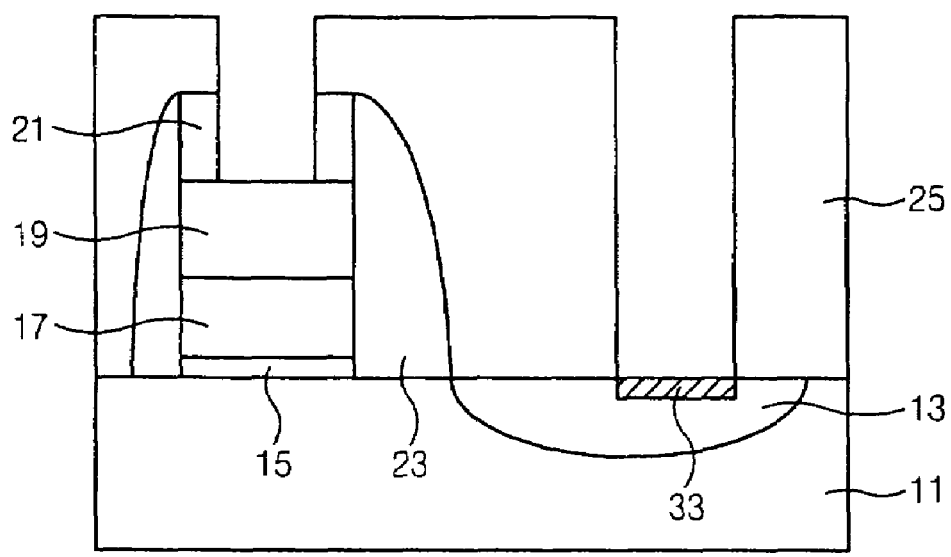

Referring to FIG. 2C, an unreacted portion of the cobalt film 31 is removed. Preferably, the removal process is performed using a SC-1 solution which is a mixture solution of $NH_4OH$, $H_2O_2$ and $H_2O$.

Figure 2D:
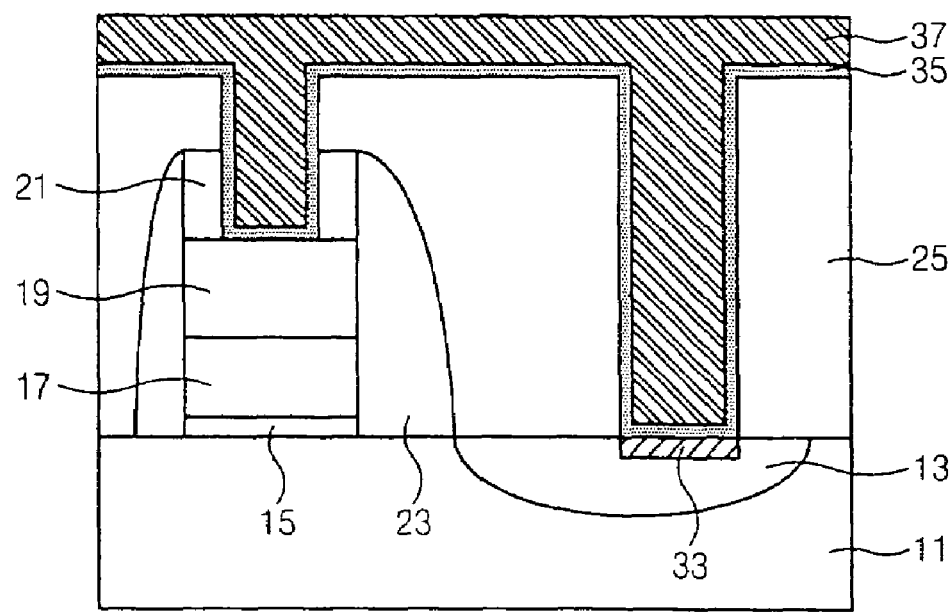

Now referring to FIG. 2D, a stacked structure 35 of a Ti film and a TiN film is formed on the semiconductor substrate 11 including the first and the second contact holes 27 and 29. Preferably, the Ti film has a thickness ranging from 100 to 200 Å and formed via a first PVD process and the TiN film has a thickness ranging from 100 to 400 Å and formed via a second PVD process.

Thereafter, a conductive layer 37 is formed on the lower insulating film 25 including the first and the second contact holes 27 and 29. Preferably, the conductive layer 37 comprises tungsten.

The conductive layer 37 is then patterned to form a conductive line pattern such as a bit line pattern or a metal wiring.

As discussed earlier, in accordance with the present invention, a cobalt silicide layer is formed on a surface of a source/drain region to stabilize contact characteristics and improve reliability of the device.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for forming conductive line of semiconductor device, comprising the steps of:

forming a lower insulating film on a semiconductor substrate including a gate electrode and an impurity junction region;

etching the lower insulating film to form a first contact hole exposing a top surface of the gate electrode and a second contact hole exposing the impurity junction region;

forming a cobalt silicide layer on the impurity junction region exposed through the second contact hole;

forming a stacked structure of a Ti film and a TiN film on the semiconductor substrate including the first and the second contact holes;

forming a conductive layer on the lower insulating film including the first and the second contact holes; and patterning the conductive layer to form a conductive line pattern.

2. The method according to claim 1, wherein the step of forming the cobalt silicide layer comprises:

forming a cobalt film on the semiconductor substrate including the first and the second contact holes;

performing a rapid thermal process to react the cobalt film with a surface of the impurity junction region; and removing an unreacted portion of the cobalt film.

3. The method according to claim 2, wherein the cobalt film is formed by a PVD method and has a thickness ranging from 50 to 150 Å.

4. The method according to claim 2, wherein the rapid thermal process comprises:

a first rapid thermal process performed at a temperature ranging from 650 to 750° C. for 10 to 30 seconds; and a second rapid thermal process performed at a temperature ranging from 800 to 880° C. for 10 to 30 seconds.

5. The method according to claim 2, wherein the unreacted portion of the cobalt film is removed using SC-1 solution.

6. The method according to claim 1, wherein the step of forming a stacked structure of a Ti film and a TiN film comprises:

forming the Ti film having a thickness ranging from 100 to 200 Å via a first PVD process; and forming the TiN film having a thickness ranging from 100 to 400 Å via a second PVD process.

7. The method according to claim 1, wherein the conductive line pattern is a bit line pattern or a metal wiring.

* * * * *